United States Patent
Chiang

(10) Patent No.: US 7,973,284 B2
(45) Date of Patent: Jul. 5, 2011

(54) IMAGE SENSING MODULE

(75) Inventor: Wen-Lin Chiang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/610,362

(22) Filed: Nov. 2, 2009

(65) Prior Publication Data

US 2011/0036982 A1 Feb. 17, 2011

(30) Foreign Application Priority Data

Aug. 13, 2009 (CN) .......................... 2009 1 0305592

(51) Int. Cl.
G02F 1/01 (2006.01)
(52) U.S. Cl. ...................................................... 250/330
(58) Field of Classification Search .................. 250/330, 250/252
See application file for complete search history.

(56) References Cited

U.S. PATENT DOCUMENTS

| 7,158,323 | B2 * | 1/2007 | Kim et al. | 359/892 |
| 2007/0069395 | A1 * | 3/2007 | Kim et al. | 257/780 |
| 2007/0291157 | A1 * | 12/2007 | Ding et al. | 348/360 |

* cited by examiner

*Primary Examiner* — David P Porta
*Assistant Examiner* — Kiho Kim
(74) *Attorney, Agent, or Firm* — Zhigang Ma

(57) ABSTRACT

An image sensing module includes a printed circuit board, an image sensor, and a color filter exchanging system. The image sensor positioned between the printed circuit board and the color filter exchanging system is assembled on the printed circuit board. The color filter exchanging system aligning with the image sensor fastens to the printed circuit board. The color filter exchanging system includes a stand, a driving module and a filter assembly. The stand fastening to the printed circuit board defines an opening revealing the image sensor. The driving module slides the filter assembly within the stand. The filter assembly includes a frame and a visible light bandpass filter and an infrared bandpass filter assembled to the frame. In different modes, the driving module drives the filter assembly so that the visible light bandpass filter or the infrared bandpass filter aligns with the image sensor by way of the opening.

16 Claims, 3 Drawing Sheets

IMAGE SENSING MODULE

BACKGROUND

1. Technical Field

The present disclosure relates to an image sensing module having a color filter exchanging system.

2. Description of the Related Art

Some current image capture devices may comprise a color filter exchanging system for shifting a work mode of the image capture devices between a day mode and a night mode. In detail, the color filter exchanging system comprises a visible light bandpass filter and an infrared bandpass filter, which can be selectively inserted between a lens module and an image sensor of the image capture devices. When an environment is bright enough, the color filter exchanging system inserts the visible light bandpass filter between the lens module and the image sensor so that the image capture device can capture color images. When the environment is too dark, the color filter exchanging system inserts the infrared bandpass filter between the lens module and the image sensor so that the image capture device can capture monochrome (i.e., infrared) images. However, the color filter exchanging system usually employs an electric motor to insert and withdraw the visible light bandpass filter and the infrared bandpass filter, thus resulting in a complicated and high-cost color filter exchanging system.

Therefore, it is desirable to provide an image sensing module which can overcome the described limitations.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present image sensing module having same. Moreover, in the drawings, like reference numerals designate corresponding parts throughout the views.

DETAILED DESCRIPTION

Embodiments of the image sensing module are now described in detail here with reference to the drawings.

Figure 1:
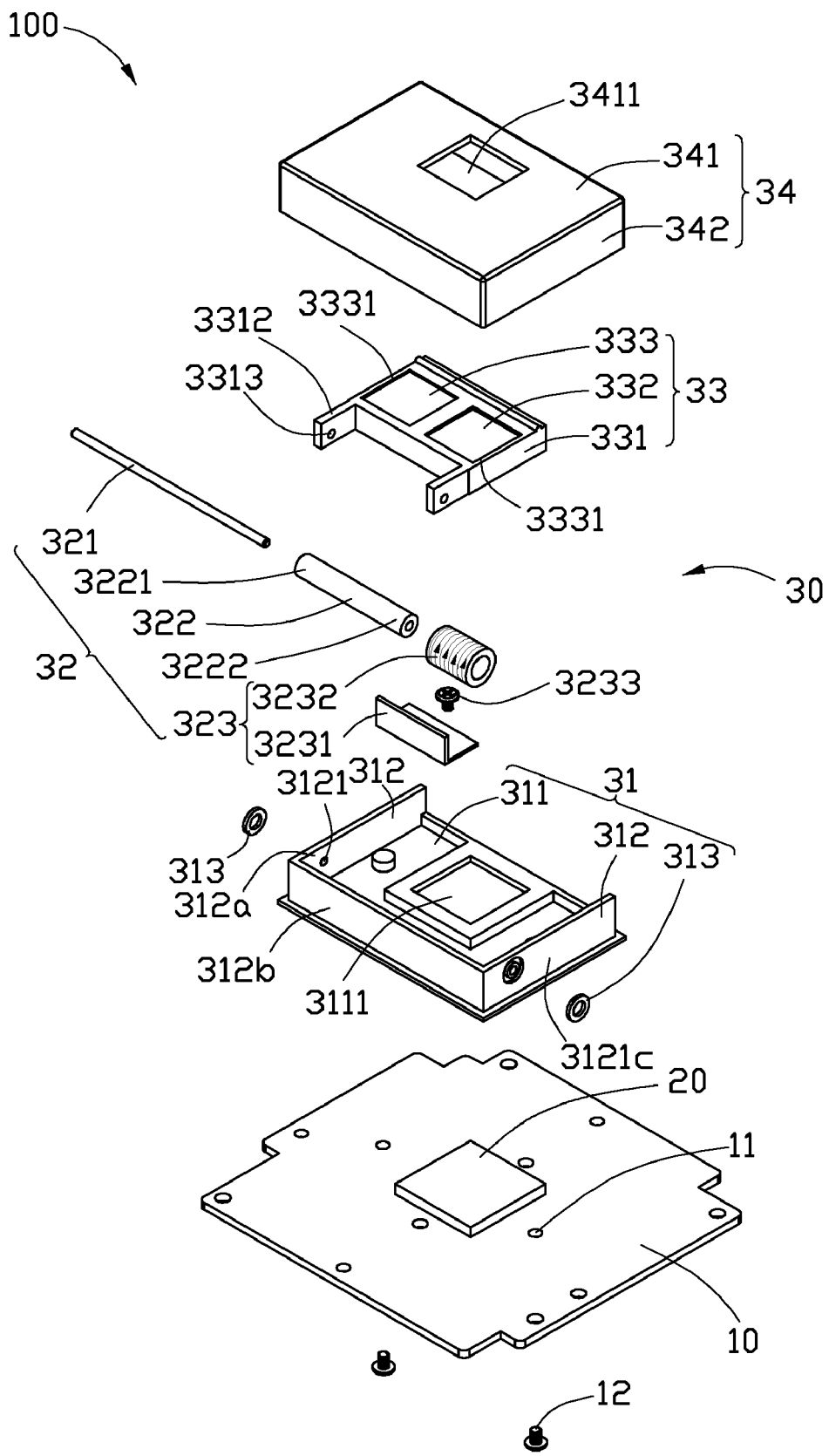
FIG. 1 is an isometric, exploded, schematic view of an image sensing module, according to an embodiment.

FIG. 1 is an isometric, exploded view of an image sensing module 100. The image sensing module 100 includes a printed circuit board (PCB) 10, an image sensor 20, and a color filter exchanging system 30. The image sensor 20 is assembled on the PCB 10 and configured for capturing images. The color filter exchanging system 30 is aligned with the image sensor 20 fixed on the PCB 10.

The PCB 10 defines a plurality of first through holes 11. The color filter exchanging system 30 is fastened to the PCB 10 by a plurality of first fasteners 12, such as screws, passing through the first through holes 11 and into the color filter exchanging system 30. The image sensor 20 is a charge coupled device (CCD) or complementary metal-oxide semiconductor (CMOS).

The color filter exchanging system 30 includes a stand 31, a driving module 32, a filter assembly 33, and a cover 34. The stand 31 is fastened to the PCB 10 by the first fasteners 12. The driving module 32 is positioned within the stand 31. The cover 34 covers the stand 31.

The stand 31 is configured for accommodating the driving module 32 and the filter assembly 33. The stand 31 includes a rectangular plate 311, three lateral walls 312 connected perpendicular to three edges of the rectangular plate 311, and annular magnets 313 positioned on a pair of the parallel lateral walls 312. The three lateral walls 312 include a first lateral wall 312a, a second lateral wall 312b, and a third lateral wall 312c. The second lateral wall 312b is connected with the first, third lateral walls 312a, 312c and the first lateral wall 312a is parallel to the third lateral wall 312c, and the first, third lateral walls 312a, 312c define second through holes 3121 aligned with each other. The rectangular plate 311 defines a first opening 3111 aligned with the image sensor 20 for allowing light pass therethrough. The annular magnets 313 are positioned on outer sides of the first, third lateral walls 312a, 312c. Each of the second through holes 3121 is aligned with a central through hole of the corresponding annular magnet 313 for assembling the driving module 32 (see below). The two annular magnets 313 are positioned so that matching magnetic poles, such as N, thereof face each other.

The driving module 32 includes a guide post 321, a hollow metal post 322 sleeving the guide post 321, and a coil unit 323 sleeving the hollow metal post 322. The guide post 321 is cylindrical and two ends thereof are received in the two second through holes 3121 respectively. The hollow metal post 322 includes a first end 3221 and a second end 3222 opposite to the first end 3221. The coil unit 323 includes an L-shaped plate 3231 and a solenoid 3232 fixed to the L-shaped plate 3231. The L-shaped plate 3231 is fastened to the stand 31 by a second fastener 3233 received in the stand 31. The solenoid 3232 is wound in a specific direction by coils (not labeled). The length of the solenoid 3232 is less than that of the hollow metal post 322 and the inner diameter of the solenoid 3232 is greater than that of the hollow metal post 322. When an electric current is applied to the solenoid 3232 to form an induced magnet field, the first end 3221 and the second end 3222 form the same pole corresponding to the inductance magnet field. In another example, the solenoid 3232 can be glued to the L-shaped plate 3231.

The filter assembly 33 includes a frame 331, a visible light bandpass filter 332, and an infrared bandpass filter 333. The frame 331 defines two second openings 3331 adjacent to each other for assembling the visible light bandpass filter 332 and the infrared bandpass filter 333 therein. Both the frame 33 and the second openings 3331 are rectangular. The second openings 3121 are arranged in a line parallel to the length of the driving module 32. The filter assembly 33 further includes a pair of supporting arms 3312 parallel to each other and extending from two sides of the frame 331 perpendicular to the length of the driving module 32. Each of the supporting arms 3312 defines a third through hole 3313 in one end thereof away from the frame 331. The third through holes 3313 are aligned with the second through holes 3121. A distance between the two supporting arms 3312 exceeds the length of the hollow metal post 322. The filter assembly 33 is smaller than the stand 31, about, for example, ⅔ as big as the stand 31. In assembly, the guide post 321 sequentially passes through one of the second through holes 3121, one third through hole 3313, the hollow metal post 322, another third through hole 3313, and another second through hole 3121. As such, the driving module 32 and the filter assembly 33 are assembled into the stand 31. The lateral walls 312 surround the supporting arms 3312.

The cover 34 is configured for covering the driving module 32 and the filter assembly 33 fixed on the stand 31. The cover 34 includes a rectangular cover sheet 341 and four fifth lateral walls 342 perpendicularly extending downwards from four edges of the cover sheet 341. The cover sheet 341 defines a third opening 3411 aligned with the first opening 3111. The fifth lateral walls 342 surround the stand 31.

Figure 2:
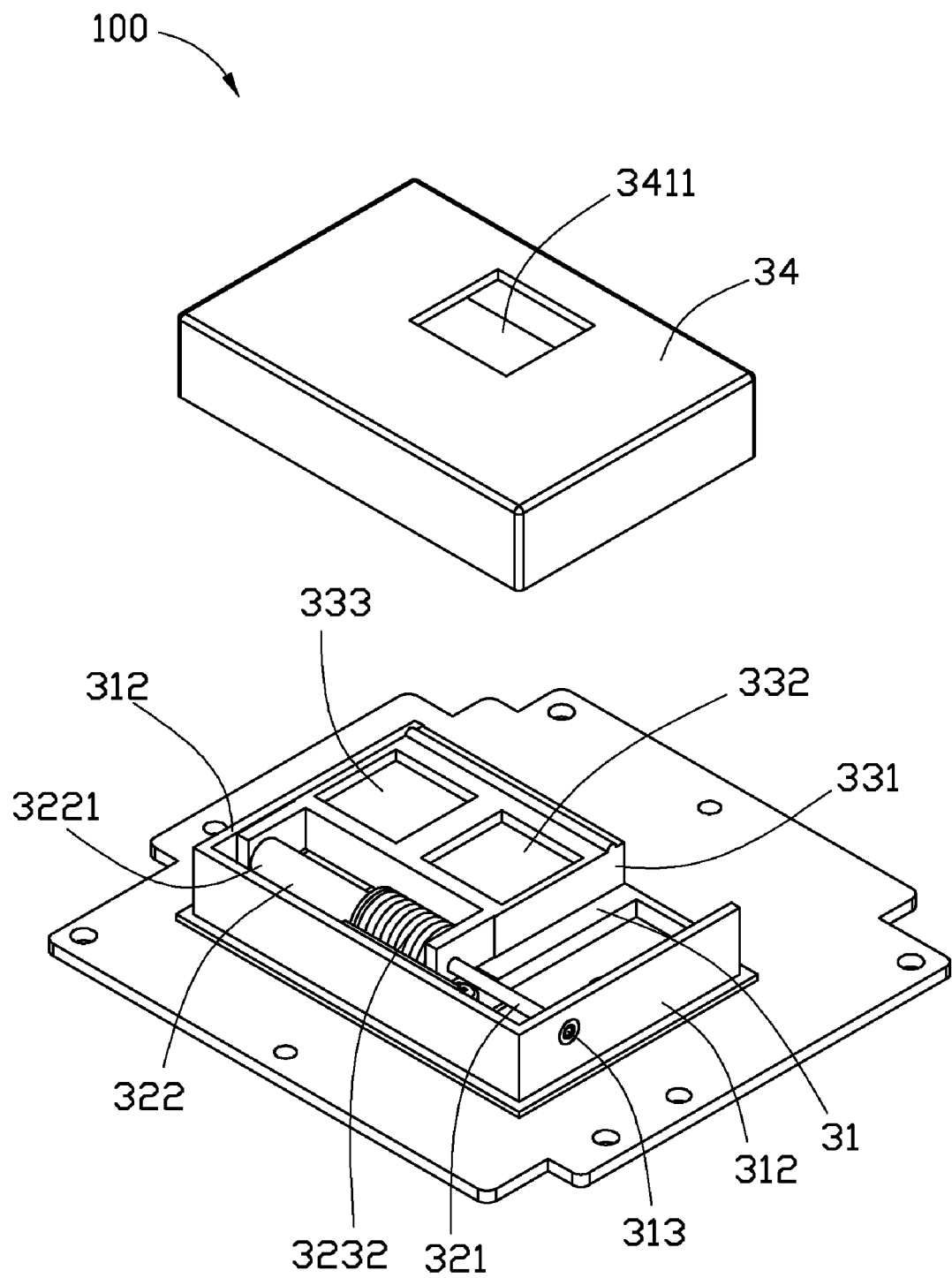
FIG. 2 is an isometric, partially assembled, schematic view of the image sensing module of FIG. 1, in a first state.
Figure 3:
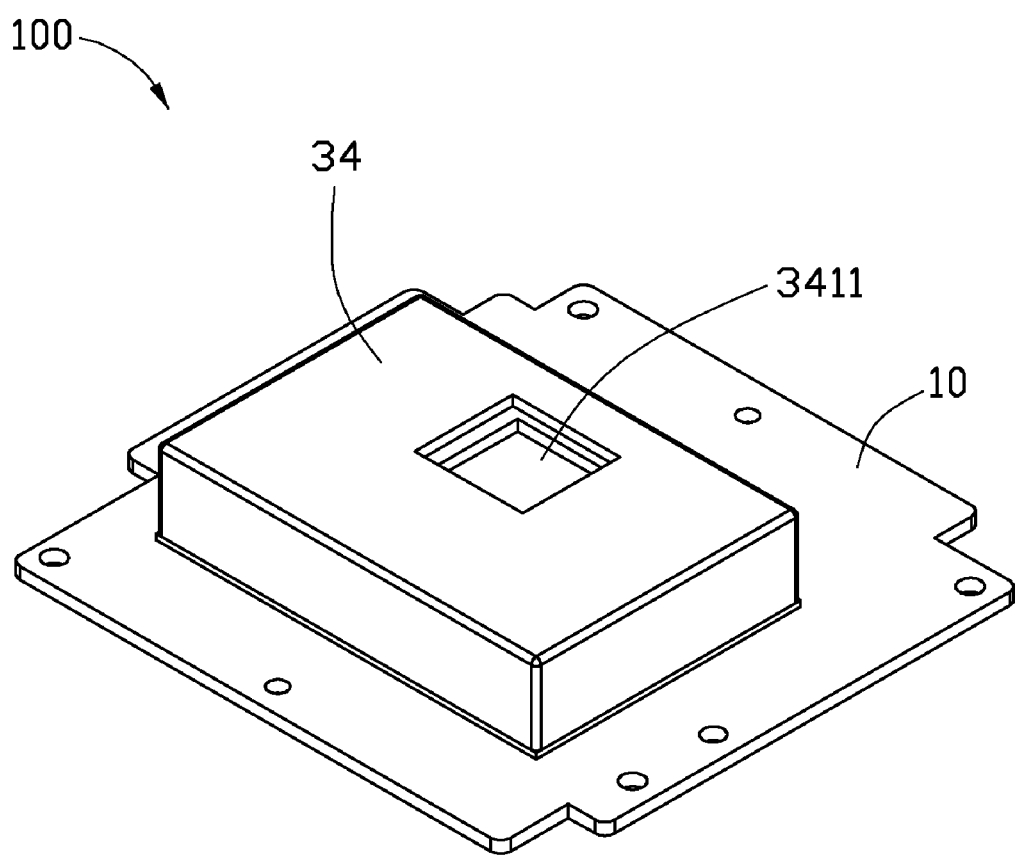
FIG. 3 is an isometric, fully assembled, schematic view of the image sensing module of FIG. 1, in a second state.

Please referring to FIGS. 2-4, in daylight use, the visible light bandpass filter 332 will be inserted into an optical path formed by the third opening 3411, the first opening 3111, and the image sensor 20 (as shown in FIG. 2). Accordingly, a specific polarity of voltage is applied to the solenoid 3233 and an induced magnetic field generated. The first end 3221 of the hollow metal post 322 is magnetized as, for example, S pole, and the second end 3222 of the hollow metal post 322 is magnetized as, correspondingly, N pole. The frame 331 is thus moved by the driving module 32 toward the first lateral wall 312a until the frame 331 is biased thereagainst by way of magnetic attraction between the hollow metal post 322 and the magnet 313 (as detailed above, the magnetic poles of the magnets 313 facing the hollow metal post 322 are N). In low light, the infrared bandpass filter 333 will be inserted into the light path. Accordingly, reverse polarity voltage is applied to the solenoid 3232. The magnetic poles of the hollow metal post 322 are reversed accordingly. As a result, the hollow metal post 322 is slid toward the lateral wall 312c by way of magnetic attraction between the magnets 313 and the hollow metal post 322, until the frame 331 is biased against the third later wall 312c.

The color filter exchanging system 30 can selectively place the infrared bandpass filter 333 or the visible light bandpass filter 332 into the light path to alternate the image sensing module 100 between a day mode and a night mode using a simply structured, compact driving module 32 with clear advantages thereof over systems utilizing electric motors.

While the disclosure has been described by way of example and in terms of exemplary embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image sensing module, comprising:
a printed circuit board;
an image sensor assembled on the printed circuit board and configured for capturing images; and
a color filter exchanging system aligned with the image sensor and fastened to the printed circuit board, the color filter exchanging system comprising a stand, a driving module, and a filter assembly, the stand being fastened to the printed circuit board and defining a first opening revealing the image sensor, the driving module being assembled to the filter assembly and sliding the filter assembly within the stand, the filter assembly comprising a frame, a visible light bandpass filter, and an infrared bandpass filter assembled to the frame;
wherein the image sensor is positioned between the printed circuit board and the color filter exchanging system, and the visible light bandpass filter or the infrared bandpass filter can selectively aligns with the image sensor; wherein a cover covering the stand and defining a second opening aligning with the first opening; wherein the stand comprises a rectangular plate, lateral walls connected perpendicularly to the rectangular plate, and magnets positioned on a pair of the parallel lateral walls, the rectangular plate defining the first opening exposing the image sensor, the lateral walls comprising a first lateral wall, a second lateral wall, and a third lateral wall connected to the first and second lateral walls, wherein the first and second lateral walls are parallel and define first through holes to mount the driving module.

2. The image sensing module of claim 1, wherein the filter assembly further comprises a pair of parallel supporting arms extending perpendicular from the frame, each of the supporting arms defining a second through hole connected with the driving module.

3. The image sensing module of claim 2, wherein the lateral walls surround the supporting arms, and the first through holes align the second through holes.

4. The image sensing module of claim 3, wherein the driving module comprises a guide post, a hollow metal post passing the guide stock therethrough, and a coil unit passing the hollow metal post therethrough, the hollow metal post being shorter than the distance between the two second through holes, with ends of the guide post respectively passing through the first through holes.

5. The image sensing module of claim 3, wherein the filter assembly is smaller than the stand.

6. The image sensing module of claim 5, wherein a size ratio of the filter assembly and the stand is about $2/3$.

7. The image sensing module of claim 1, wherein the visible light bandpass filter is positioned along an optical path of the first and second openings when the image sensor is in day mode.

8. The image sensing module of claim 1, wherein the infrared bandpass filter is positioned along an optical path of the first and second openings when the image sensor is in night mode.

9. An image sensing module, comprising:
a printed circuit board;
an image sensor assembled on the printed circuit board and configured for capturing images; and
a color filter exchanging system aligned with the image sensor and fastened to the printed circuit board, the color filter exchanging system comprising a stand, a driving module, a filter assembly, and a cover, the stand fastening to the printed circuit board and defining a first opening exposing the image sensor, the driving module being assembled to the filter assembly and sliding the filter assembly within the stand, the filter assembly comprising a frame, a visible light bandpass filter, and an infrared bandpass filter assembled to the frame, with the cover covering the stand and defining a second opening aligned with the first opening,
wherein the image sensor is positioned opposite to the color filter exchanging system; wherein the stand comprises a rectangular plate, lateral walls connected perpendicularly to the rectangular plate, and magnets positioned on a pair of the parallel lateral walls, the rectangular plate defining the first opening exposing the image sensor, the lateral walls comprising a first lateral wall, a second lateral wall, and a third lateral wall connected to the first and second lateral walls, wherein the first and second lateral walls are parallel and define first through holes to mount the driving module.

10. The image sensing module of claim 9, the filter assembly further comprises a pair of parallel supporting arms extending perpendicular from the frame, each of the supporting arms defining a second through hole connected with the driving module.

11. The image sensing module of claim 10, wherein the filter assembly assembles to the stand, the lateral walls surrounding the supporting arms, and the first through holes aligning the second through holes.

12. The image sensing module of claim 11, wherein the driving module comprises a guide post, a hollow metal post passing the guide stock therethrough, and a coil unit passing the hollow metal post therethrough, the hollow metal post being shorter than the distance between the two second through holes, with ends of the guide post respectively passing through the first through holes.

13. The image sensing module of claim 10, wherein the filter assembly is smaller than the stand.

14. The image sensing module of claim 13, wherein a size ratio of the filter assembly and the stand is ⅔.

15. The image sensing module of claim 9, wherein the visible light bandpass filter is positioned along an optical path of the first and second openings when the image sensor is in day mode.

16. The image sensing module of claim 9, wherein the infrared bandpass filter is positioned along an optical path of the first and second openings when the image sensor is in night mode.

* * * * *